United States Patent
Flecheux

(10) Patent No.: US 6,404,244 B2
(45) Date of Patent: Jun. 11, 2002

(54) METHOD OF DIVIDING THE FREQUENCY OF A SIGNAL

(75) Inventor: Bertrand Flecheux, Livry (FR)

(73) Assignee: Koninklijke Philips Electronics N.V. (NL)

( * ) Notice: Subject to any disclaimer, the term of this patent is extended or adjusted under 35 U.S.C. 154(b) by 0 days.

(21) Appl. No.: 09/749,148

(22) Filed: Dec. 27, 2000

(30) Foreign Application Priority Data

Dec. 29, 1999 (FR) .............................. 99 16675

(51) Int. Cl.$^7$ .............................................. H03K 21/00
(52) U.S. Cl. ....................................... 327/115; 327/117
(58) Field of Search ............................. 327/113, 115, 327/117, 148, 153, 157, 161, 162; 377/64, 66, 52, 78, 107; 331/25, DIG. 2

(56) References Cited

U.S. PATENT DOCUMENTS

| | | | | |
|---|---|---|---|---|
| 3,896,388 A | * | 7/1975 | Hatsukano et al. | 327/115 |
| 4,553,218 A | * | 11/1985 | Genrich | 377/52 |
| 4,620,180 A | * | 10/1986 | Carlton | 377/64 |
| 5,878,087 A | * | 3/1999 | Ichihara | 455/180.1 |
| 5,890,051 A | * | 3/1999 | Schlang et al. | 455/76 |
| 6,057,719 A | * | 5/2000 | Austin et al. | 327/117 |
| 6,181,212 B1 | * | 1/2001 | Khoini-Poorfard et al. | 331/25 |
| 6,243,567 B1 | * | 6/2001 | Saito | 455/188.2 |

FOREIGN PATENT DOCUMENTS

| | | | | |
|---|---|---|---|---|
| EP | 0415649 A2 | 3/1991 | | H03L/7/089 |

OTHER PUBLICATIONS

Patent Abstracts of Japan, vol. 013, No. 304, 09321613, Dec. 1997.

* cited by examiner

*Primary Examiner*—Toan Tran
*Assistant Examiner*—Linh Nguyen
(74) *Attorney, Agent, or Firm*—Jack D. Slobod

(57) ABSTRACT

The method of dividing the frequency of electronic signal X0 includes: preloading a first predetermined value P(1:N) in an up/down counter L1 . . . LN, clocking the up/down counter L1 . . . LN by means of said electronic signal X0, detecting a state in which the up/down counter has a second predetermined value, and again preloading the first predetermined value P(1:N) in the up/down counter L1 . . . LN. The preloading operations are performed asynchronously. There is a reduction of the noise introduced in the power supply voltage of a frequency divider DIV by the periodical preloading operations of the up/down counter L1 . . . LN of this divider.

5 Claims, 2 Drawing Sheets

METHOD OF DIVIDING THE FREQUENCY OF A SIGNAL

Figure 1:
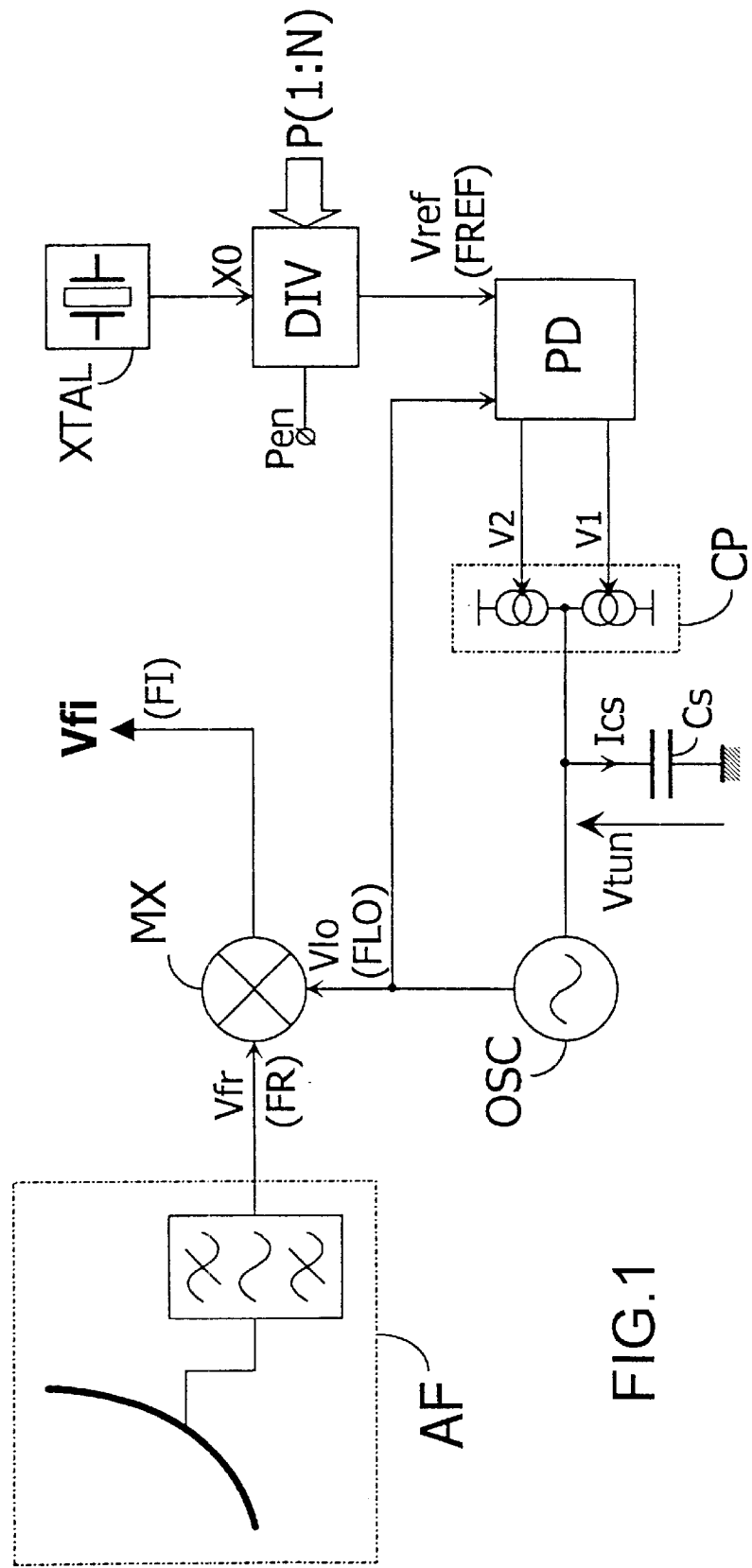

The invention relates to a method of dividing the frequency of an electronic signal, the method comprising the steps of:
- preloading a first predetermined value in an up/down counter,
- clocking the up/down counter by means of said electronic signal,
- detecting a state in which the up/down counter has a second predetermined value, and
- again preloading the first predetermined value in the up/down counter.

Such methods are currently used in multiple applications, for example, in phase-locked loops intended to regulate the frequency of an oscillator. These phase-locked loops usually comprise:
- a first local oscillator intended to supply an output signal having an oscillation frequency determined by the value of a tuning voltage,
- a second local oscillator intended to supply, via a frequency divider having a programmable division ratio, a reference signal having a reference frequency.
- a phase/frequency detector intended to compare the oscillation frequency with the reference frequency and to supply control signals representing the result of said comparison, and
- a charge pump whose conduction is intended to be controlled by the control signals, an output of the charge pump being connected to a capacitance intended to generate the tuning voltage at its terminals.

In such a phase-locked loop, the method described in the opening paragraph is performed within the frequency divider whose division ratio is determined by the difference between the first and second predetermined values. In principle, the frequency divider includes N flip-flops arranged in cascade, each of which can be preloaded by a bit of a selection signal defining one of the predetermined values.

In the known frequency division methods, the preloading operations are performed synchronously, i.e. all flip-flops are simultaneously preloaded as soon as the frequency divider has received an authorization for preloading. As each flip-flop receives its energy from a positive and a negative power supply terminal, the change of state of a flip-flop requires a current to be drawn from the positive power supply terminal. The frequency divider is mostly realized in an integrated form within an integrated circuit having power supply pins to which the power supply terminals are connected by means of conducting wires that have an inductive character. The applicant has found that the preloading operations cause perturbations in the operation of the frequency divider and in that of other elements with which the frequency divider shares its energy supply. Indeed, the applicant has noticed that a simultaneous change of states of a large number of flip-flops, which occurs periodically, involves periodical variations of the power supply terminal potentials because of the inductive character of the conducting wires connecting the power supply pins to the power supply terminals, which variations generate noise in all of the electronic signals that are present in the elements fed by means of said power supply terminals.

It is an object of the invention to remedy this drawback to a great extent by proposing a method of dividing the frequency of an electronic signal, in which method periodical preloading operations are performed without significantly perturbing the potentials of the power supply terminals.

A method as described in the opening paragraph is characterized in that the preloading operations are performed asynchronously.

In accordance with this method, there are no longer situations in which a large number of flip-flops simultaneously change their state, which prevents the periodical, strong current appeals as described above from occurring and perturbing the potentials of the power supply terminals.

In a particular embodiment of the invention, the up/down counter is constituted by N flip-flops arranged in cascade, each being intended to be preloaded periodically, while a flip-flop of the rank i (for i=2 to N) is only preloaded on the condition that the flip-flop of the rank (i−1) has been preloaded previously.

In this embodiment, the flip-flops are preloaded one after the other. The consumption of current required for a preloading operation is thus spread with respect to time, which considerably limits the amplitude of the potential variation of the power supply terminals due to this current consumption.

As stated hereinbefore, the invention in one of its embodiments also relates to a frequency divider comprising N flip-flops each having a clock input, an input for enabling the preloading operation, and an output, the output of a flip-flop of the rank i (for i=1 to N−1) being connected to the clock input of the flip-flop of rank (i+1), the clock input of the flip-flop of rank 1 being intended to receive an input signal of the divider, the output of the flip-flop of the rank N being intended to supply an output signal of the divider, frequency divider characterized in that it is provided with inhibition means prohibiting simultaneous preloading of all flip-flops.

The inhibition means advantageously comprise delay means arranged in such a way that a flip-flop of the rank i (for i=2 to N) can only receive authorization for a preloading operation on the condition that the flip-flop of rank (i−1) has been preloaded previously.

In a preferred embodiment of the invention, the inputs for enabling the preloading operation of two flip-flops of consecutive ranks are interconnected via a delay cell.

This structure ensures in a simple and low-cost manner that the flip-flops are preloaded one after the other, rather than simultaneously, as is the case in the known frequency dividers.

If the invention can be used in all types of applications using frequency division, its use is particularly advantageous in an apparatus for receiving radioelectric signals, such as a radiotelephone or a television, comprising an input stage allowing reception of a signal whose frequency is selected from within a given range of frequencies and its transformation into an electronic signal referred to as radio signal, in which apparatus a conversion of the frequency, based on the selected frequency, to a predetermined intermediate frequency is realized by means of a mixer intended to receive the radio signal and the output signal of a first local oscillator, apparatus characterized in that the frequency of the output signal of the first local oscillator is regulated by means of a phase-locked loop including a frequency divider as described hereinbefore.

These and other aspects of the invention are apparent from and will be elucidated, by way of non-limitative example, with reference to the embodiments described hereinafter.

Figure 2:
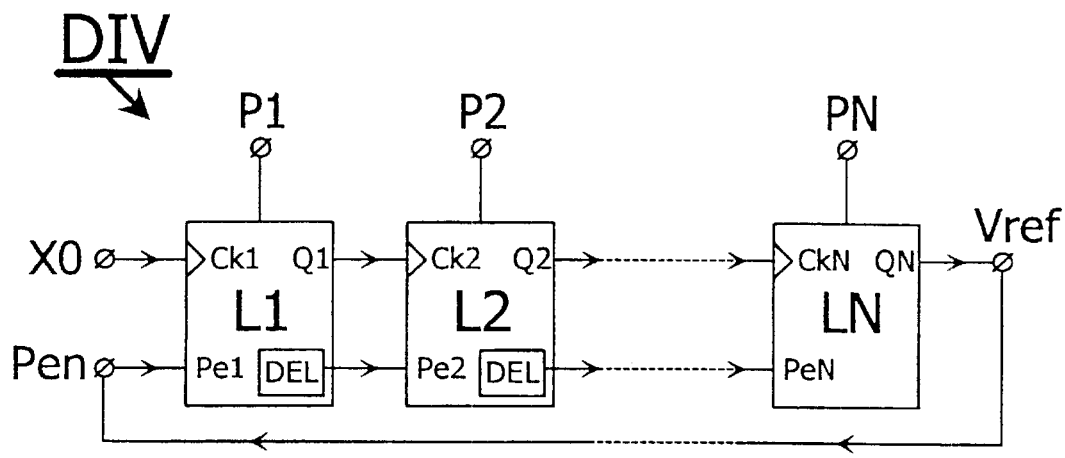
Figure 3:
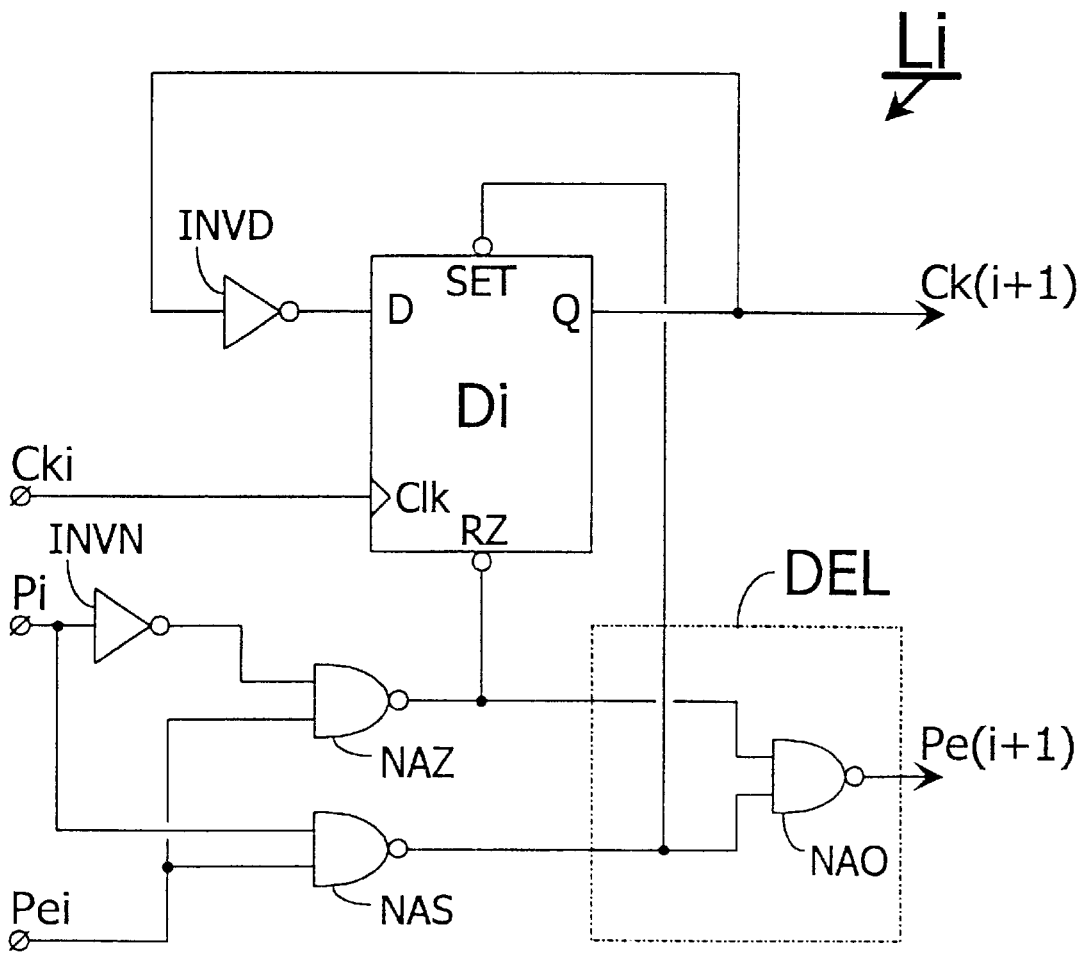

In the drawings,

FIG. 1 is a partial circuit diagram of a receiver of radioelectric signals, including a frequency divider in which the invention is employed, FIG. 2 is a partial circuit diagram of such a frequency divider, and FIG. 3 is an electric circuit diagram of a flip-flop included in a frequency divider in accordance with a preferred embodiment of the invention.

FIG. 1 shows diagrammatically an apparatus for receiving radioelectric signals, for example, a radiotelephone, comprising an input stage, consisting in this example of an antenna and filtering system AF, allowing reception of a signal whose frequency is selected from within a given range of frequencies and its transformation into an electronic signal Vfr referred to as radio signal, in which apparatus a frequency conversion of the frequency, from a selected radio frequency FR, to a predetermined intermediate frequency FI, is performed by means of a mixer MX intended to receive the radio signal Vfr and an output signal Vlo of a first local oscillator OSC having an oscillation frequency FLO.

The intermediate frequency FI is fixed and is equal to the difference between the radio frequency FR and the oscillation frequency FLO. The choice of said oscillation frequency FLO thus determines the value of the selected radio frequency FR.

In this apparatus, the oscillation frequency FLO is regulated by means of a phase-locked loop, which comprises:

the first local oscillator OSC intended to supply the output signal Vlo whose oscillation frequency FLO is determined by the value of a tuning voltage Vtun, a second local oscillator XTAL intended to supply, via a frequency divider DIV having a programmable division ratio, a reference signal Vref having a reference frequency FREF.

a phase/frequency detector PD intended to compare the oscillation frequency FLO with the reference frequency FREF and to supply control signals V1 and V2 representing the result of said comparison, a charge pump CP whose conduction is intended to be controlled by the control signals V1 and V2, an output of the charge pump being connected to a capacitance Cs intended to generate the tuning voltage Vtun at its terminals.

The division ratio of the frequency divider DIV is programmed by means of a choice of the value of a selection signal P(1:N), which value is intended to be periodically preloaded in the N flip-flops constituting a known up/down counter in the frequency divider DIV. This preloading operation is performed when a preload enable input of the frequency divider DIV receives an active preloading enable signal Pen, for example, at a logic level 1. As the up/down counter has been preloaded at the first predetermined value, which is the value of the selection signal P(1:N), it is subsequently timed by an output signal X0 of the second local oscillator XTAL, which will be, for example, a quartz oscillator.

In the case where the up/down counter operates in the down-counting mode, the first predetermined value will be different from zero, and the down counter will supply an inactive edge, for example, a falling edge when it has counted down until the second predetermined value.

In the two previous cases, the choice of the value of the selection signal determines the ratio of the frequency division effected by the frequency divider DIV.

If the oscillation frequency FLO is higher than the reference frequency FREF, the phase detector PD puts a first control signal V1 in the active state, ordering the charge pump CP to supply a positive current Ics. This current, transmitted to the capacitance Cs, increases the value of the tuning voltage Vtun taken from the terminals of the capacitance Cs and thus increases the oscillation frequency FLO.

When the oscillation frequency FLO becomes lower than the reference frequency FREF, the phase detector PD puts a second control signal V2, complementary to the first control signal V1, in the active state, which inverts the direction of the current Ics, which becomes negative. This negative current, transmitted to the capacitance Cs, diminishes the value of the tuning voltage Vtun taken from the terminals of the capacitance Cs and thus diminishes the oscillation frequency FLO. The phase-locked loop will tend towards a balanced regime, also referred to as locked on regime, in which FLO=FREF.

FIG. 1 only shows the receiver section of the apparatus, but it should be noted that, in the case where the apparatus also has a transmitter section, as is the case for a radiotelephone, said transmitter section also realizes a frequency conversion from the intermediate frequency to a transmission frequency, which frequency conversion can also be carried out by means of a phase-locked loop comprising a frequency divider in which the invention is employed. In certain applications, the output signal of the mixer MX may be demodulated by means of another phase-locked loop in accordance with the invention.

FIG. 2 is a circuit diagram partially showing a frequency divider DIV in accordance with an embodiment of the invention. This frequency divider comprises N flip-flops Li (for i=1 to N) each having a clock input Cki, an input Pei for enabling the preloading operation, and an output Qi. When a flip-flop Li (for i=1 to N) receives an active signal, for example, at a logic level 1, at its preload enable input Pei, a bit Pi is preloaded in said flip-flop Li, i.e. its output Qi recopies the value of the bit Pi. In this example, the bits Pi jointly constitute the selection signal P(1:N). The output Qi of a flip-flop of rank i (for i=1 to N−1) is connected to the clock input Ck(i+1) of the flip-flop of rank (i+1). The clock input Ck1 of the flip-flop of rank 1 L1 is intended to receive the input signal of the divider DIV, constituted in this example by the output signal X0 of the second local oscillator XTAL. The output of the flip-flop of rank N LN is intended to supply the output signal of the divider DIV, here constituting the reference signal Vref.

This frequency divider DIV is provided with inhibition means prohibiting simultaneous preloading of all flip-flops. Indeed, the preload enable inputs Pei are cascaded and thus arranged in series, rather than in parallel, as is the case in the known frequency dividers.

In the embodiment of the divider DIV described with reference to this Figure, the inhibition means comprise delay means DEL which are controlled in such a way that a flip-flop of the rank i L1 (for i=2 to N) can only receive authorization for a preloading operation on the condition that the flip-flop of rank (i−1) L(i−1) has been preloaded previously.

In this embodiment, the flip-flops Li are preloaded one after the other. The consumption of current required for preloading N flip-flops L1 . . . LN is thus spread with respect to time, which considerably limits the amplitude of the potential variation of the power supply terminals due to this current consumption. Indeed, this variation relates to a potential difference generated by a conducting wire, which connects a power supply terminal of the integrated circuit comprising the frequency divider, and a pin which connects the integrated circuit to the exterior. As the conducting wire has an inductive character, the potential difference it generates is expressed in the form of L.di/dt, in which L is the inductance of the conducting wire, di is the variation of the current flowing through said wire, and dt is the time interval during which said variation occurs. With di being constant, the larger dt, the smaller the amplitude of the potential variation of the power supply terminal caused by the variation di of the current flowing through the conducting wire.

In the embodiment described here, the up/down counter operates in the up-counting mode: if the first predetermined value is the value zero, i.e. Pi=0 (for i=1 to N), there must be $2^N$ active edges of X0 to cause a rising edge of Vref to appear, which means that the frequency division ratio realized by the divider DIV is equal to $2^N$.

The output QN of the flip-flop of rank N LN has been connected to the preload enable input Pe1 of the flip-flop of rank 1 L1. This is a very simple means of ensuring a periodical preloading of the first predetermined value in the up/down counter constituted by the N flip-flops L1 ... LN. In other embodiments, the preloading enable signal for the first flip-flop L1 can be generated in a different way. Thus, if the up/down counter operates in the down-counting mode, an inverter will be inserted between the output QN of the flip-flop of rank N LN and the preload enable input Pe1 of the flip-flop of rank 1 L1, unless the flip-flop of rank N has an inverting output, which will then be directly connected to the preload enable input Pe1. In these two cases, the Nth bit PN of the selection signal P(1:N) will be kept at the logic level 1.

FIG. 3 is an electric circuit diagram showing an embodiment of one of the flip-flops Li (for i=1 to N) in a frequency divider in accordance with the invention. This flip-flop Li comprises a D-latch Di having a data input D, a data output Q, a clock input Clk, a reset input RZ and a set input SET. The data output Q is connected to the data input D via an inverter INVD and is intended to be connected to the clock input Ck(i+1) of the flip-flop of the following rank L(i+1). The clock input Clk of the D-latch Di constitutes the clock input Cki of the flip-flop Li.

In the embodiment described here, the data output Q is immediately put in the active state, i.e. at the logic level 1, when the D-latch Di receives in an inactive state, for example, a logic level 0, at its set input SET. When the D-latch Di receives in an inactive state, i.e. a logic level 0, at its reset input RZ, the data output Q is immediately put in the inactive state, i.e. at the logic level 0.

The flip-flop Li also has a preload input Pi intended to receive the bit of the rank i of the selection signal P(1:N), and a preload enable input Pei.

The flip-flop Li comprises a first NAND gate NAZ having an input which is connected to the preload input Pi via an inverter INVN, another input which is connected to the preload enable input Pei, and an output which is connected to the reset input RZ of the D-latch Di. The flip-flop Li comprises a second NAND gate NAS having an input which is directly connected to the preload input Pi, another input which is connected to the preload enable input Pei, and an output which is connected to the set input SET of the D-latch Di. The flip-flop Li comprises a third NAND gate NAO having two inputs which are connected to the outputs of the first and second NAND gates NAZ and NAS, and an output intended to be connected to the preload enable input Pe(i+1) of the flip-flop of the following rank L(i+1).

In normal operating mode, the preload enable input Pei of the flip-flop Li is in an inactive state, i.e. at the logic level 0 in this embodiment, which imposes a logic level 1 on the output of the first and second NAND gates NAZ and NAS and thus inhibits the preload of the D-latch Di, while the output of the third logic gate NAO is maintained at the logic level 0, which ensures a preload inhibition of the next flip-flop L(i+1). The D-latch Di then divides the frequency of the signal received at its clock input Clk by two. Indeed, if at an instant t0, the data output Q of the D-latch Di is at the logic level 0, its data input D is at the logic level 1. When the clock input Clk receives an active edge, in this case a rising edge, the data output Q flips to the logic level 1, which information is translated after its passage through the inverter INVD by setting the data input D to the logic level 0. At the next active edge received by the clock input Clk, the data output Q retrieves the logic level 0, and a rising edge at the clock input Clk is again required for producing a new rising edge at the data output Q. Two rising edges must thus be provided at the clock input of the D-latch Di, if said latch is to produce a single rising edge at its data output Q.

When the flip-flop Li receives an active level, i.e. a logic level 1 in this example, at its preload enable input Pei, the preloading of the D-latch Di is no longer inhibited. If the bit of the rank i of the selection signal P(1:N) is at the logic level 0, the output of the inverter INVN is at the logic level 1, and the output of the first NAND gate NAZ changes to the logic level 0, thus ordering an immediate reset of the data output Q of the D-latch Di. If the bit of the rank i of the selection signal P(1:N) is at the logic level 1, the output of the inverter INVN is at the logic level 0, and the output of the second NAND gate NAS changes to the logic level 0, thus ordering an immediate set of the data output Q of the D-latch Di. The bit of the rank i of the selection signal P(1:N) is thus preloaded in the flip-flop Li.

The output of the third NAND gate NAO can switch from the logic level 0 to the logic level 1 only when the output of one of the first or second NAND gates NAZ or NAS has changed to the logic level 0, and thus when the flip-flop Li has been preloaded. Such a switch is not instantaneous, but occurs after a transit time intrinsic to the logic gate AND, of the order of one nanosecond. The gate NAO thus constitutes a delay cell DEL inserted between the preload enable inputs of two consecutive flip-flops Li and L(i+1), which ensures that the flip-flops constituting the frequency divider are not preloaded simultaneously but one after the other.

If, in the examples described, the active and inactive states correspond to the logic levels 1 and 0, respectively, the inverse is evidently also feasible. This will involve minor adaptations of the structures described hereinbefore, which those skilled in the art may deduce from the Morgan theorems.

What is claimed is:

1. A method of dividing the frequency of an electronic signal, the method comprising the steps of:

preloading a first predetermined value in an up/down counter, clocking the up/down counter by means of said electronic signal, detecting a state in which the up/down counter has a second predetermined value, and again preloading the first predetermined value P(1:N) in the up/down counter, characterized in that the preloading operations are performed asynchronously, wherein the up/down counter comprises N flip-flops arranged in cascade, each for being preloaded periodically, while a flip-flop of the rank i (for i=2 to N) is only preloaded on the condition that the flip-flop of the rank (i−1) has been preloaded previously.

2. A frequency divider comprising N flip-flops each having a clock input, an input for enabling the preloading operation, and an output, the output of a flip-flop of the rank i (for i=1 to N−1) being connected to the clock input of the flip-flop of rank (i+1), the clock input of the flip-flop of rank 1 being for receiving an input signal of the divider, the output of the flip-flop of ranked N being for supplying an output signal of the divider, the frequency divider being characterized in that it is provided with inhibition means prohibiting simultaneous preloading of all flip-flops.

3. A frequency divider as claimed in claim 2, wherein the inhibition means comprise delay means which are arranged in such a way that a flip-flop of the rank i (for i=2 to N) can only receive authorization for a preloading operation on the condition that the flip-flop of rank (i−1) has been preloaded previously.

4. A frequency divider as claimed in claim 3, wherein the inputs for enabling the preloading operation of two flip-flops of consecutive ranks are interconnected via a delay cell.

5. A frequency divider comprising N units arranged in cascade, wherein an input of the first unit being is coupled to receive an input signal of the divider;

an output of each unit except for the last being coupled to the clock input of the next unit;

an output of the last unit being for supplying an output signal of the divider;

each unit also comprising:

a preload input;

a preload enable input; and means for inhibiting the preload enable input, so that the units are not all preloaded simultaneously.

* * * * *